(12) United States Patent
Seo et al.

(10) Patent No.: US 9,847,107 B2
(45) Date of Patent: Dec. 19, 2017

(54) ELECTRONIC DEVICE AND SYSTEM THAT INITIALIZES LOGIC CIRCUITS AT DIFFERENT TIMES BY SEQUENTIALLY DELAYING A POWER UP SIGNAL TO A PLURALITY OF INTERNAL CIRCUIT BLOCKS

(71) Applicant: SK hynix Inc., Gyeonggi-do (KR)

(72) Inventors: Jin-Cheol Seo, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 14/531,704

(22) Filed: Nov. 3, 2014

(65) Prior Publication Data

US 2015/0364161 A1 Dec. 17, 2015

(30) Foreign Application Priority Data

Jun. 16, 2014 (KR) ........................ 10-2014-0072995

(51) Int. Cl.
| | |
|---|---|
| *G11C 5/14* | (2006.01) |
| *G11C 7/20* | (2006.01) |
| *H03K 5/15* | (2006.01) |
| *G11C 29/00* | (2006.01) |
| *G11C 17/18* | (2006.01) |
| *G11C 17/16* | (2006.01) |

(52) U.S. Cl.
CPC .............. *G11C 5/148* (2013.01); *G11C 7/20* (2013.01); *G11C 29/789* (2013.01); *H03K 5/15* (2013.01); *G11C 17/16* (2013.01); *G11C 17/18* (2013.01)

(58) Field of Classification Search
CPC ......... G06F 15/177; G11C 17/16; G11C 7/20; G11C 29/789; G11C 5/148; G11C 17/18; Y10T 307/76; H03K 5/15
See application file for complete search history.

(56) References Cited

U.S. PATENT DOCUMENTS

| | | | | |
|---|---|---|---|---|
| 5,107,140 A | * | 4/1992 | Sherman ................. | H03G 3/30 327/306 |
| 2008/0288196 A1 | * | 11/2008 | Singh ................. | G01R 31/3016 702/79 |
| 2011/0235453 A1 | * | 9/2011 | Chi ........................ | G11C 17/16 365/225.7 |
| 2015/0009772 A1 | * | 1/2015 | Chen ..................... | G11C 11/417 365/227 |
| 2015/0198933 A1 | * | 7/2015 | Coutts ................ | H03K 19/0016 307/115 |

FOREIGN PATENT DOCUMENTS

KR 1020110002282 1/2011

* cited by examiner

*Primary Examiner* — Terrell Johnson
(74) *Attorney, Agent, or Firm* — IP & T Group LLP

(57) ABSTRACT

An electronic device includes a power-up signal generation circuit block suitable for generating a power-up signal during a power-up section of a source voltage, a delay circuit block suitable for generating a plurality of delay signals by sequentially delaying the power-up signal, and a plurality of internal circuit blocks sequentially initialized in response to a corresponding one of the power-up signal and the delay signals.

11 Claims, 6 Drawing Sheets

ELECTRONIC DEVICE AND SYSTEM THAT INITIALIZES LOGIC CIRCUITS AT DIFFERENT TIMES BY SEQUENTIALLY DELAYING A POWER UP SIGNAL TO A PLURALITY OF INTERNAL CIRCUIT BLOCKS

CROSS-REFERENCE TO RELATED APPLICATIONS

The present application claims priority of Korean Patent. Application No. 10-2014-0072995, filed on Jun. 16, 2014, which is incorporated herein by reference in its entirety.

BACKGROUND

1. Field

Exemplary embodiments of the present invention relate to an electronic device using a voltage and an electronic system including the electronic device.

2. Description of the Related Art

An electronic system including an electronic device generally includes a voltage generation device for generating and supplying a voltage required for driving the electronic device. A voltage generation device may generate voltages for a plurality of electronic devices. In other words, the electronic system may be formed of one voltage generation device and a plurality of electronic devices, Electronic devices include many logic circuits. Generally, the logic circuits need an initialization operation during an initial operating period to stably operate the electronic device.

FIG. 1 illustrates an electronic system according to prior art.

Referring to FIG. 1, the electronic system 100 includes a voltage generation device 110 for generating a power supply voltage VDD and a ground voltage VSS, and first to $n^{th}$ electronic devices 120_1 to 120_n. The first to $n^{th}$ electronic devices 120_1 to 120_n perform predetermined operations using the power supply voltage VDD and the ground voltage VSS, and are initialized during an initial period of generating the power supply voltage VDD, i.e., a power-up section.

Since the first to $n^{th}$ electronic devices 120_1 to 120_n have the same structure, the first electronic device 120_1 is representatively described below. A Dynamic Random Access Memory (DRAM) device will be used as an example of the first electronic device 120_1.

FIG, 2 illustrates the internal structure of the first electronic device 120_1 shown in FIG. 1.

Referring to FIG. 2, the first electronic device 120_1 includes first to fourth memory blocks 120_11. to 120_14, a power-up signal generation circuit block 120_15, and first to fourth fuse circuit blocks 120_16 to 120_19. The first to fourth memory blocks 120_11 to 120_14 store and supply data. The power-up signal generation circuit block 120_15 generates a power-up signal PWR_UP1 which is enabled during the power-up section of the power supply voltage VDD. The first to fourth fuse circuit blocks 120_10 to 120_19 correspond to the first to fourth memory blocks 120_11 to 20_14, respectively, and repair the first to fourth memory blocks 120_11 to 120_14 in response to the power-up signal PWR_UP1.

Each of the first to fourth memory blocks 120_11 to 120_14 includes a bank.

The power-up signal generation circuit block 120_15 generates the power-up signal PWR_UP1 which pulses during the power-up section, when the power supply voltage VDD rises with a constant grade to a target level VDD, starting from approximately 0V. In other words, the power-up signal generation circuit block 120_15 enables the power-up signal PWR_UP1 when the power supply voltage VDD powers up and disables the power-up signal PWR_UP1 when the power supply voltage VDD rises above a predetermined level.

The first to fourth fuse circuit blocks 120_16 to 120_19 store addresses of defective memory cells included in the first to fourth memory blocks 120_11 to 120_14, respectively, to substitute defective memory cells with redundancy memory cells. Particularly, each of the first to fourth fuse circuit blocks 120_16 to 120_19 includes a latch unit (not illustrate), and each latch unit is initialized by the power-up signal PWR_UP1 and latches a predetermined logic level as an initial value.

However, the electronic system 100 having the aforementioned structure has the following concerns, Since the first to $n^{th}$ electronic devices 120_1 to 120_n receive and share the power supply voltage VDD, the first to $n^{th}$ electronic devices 120_1 to 120_n power up simultaneously and thus the first to $n^{th}$ electronic devices 120_1 to 120_n simultaneously perform their initialization operations. Since first to fourth fuse circuit blocks included in each of the first to $n^{th}$ electronic devices 120_1 to 120_n are simultaneously initialized during the power-up section, this may result in high peak current P being drawn in the electronic system 100 during the initialization operation, which is described in FIG. 3.

SUMMARY

Exemplary embodiments of the present invention are directed to an electronic device that initializes its logic circuits at different times, and an electronic system including the electronic device.

Also, the exemplary embodiments of the present invention are directed to an electronic system that initializes electronic devices at different times.

In accordance with an embodiment of the present invention, an electronic device includes a power-up signal generation circuit block suitable for generating a power-up signal during a power-up section of a source voltage, a delay circuit block suitable for generating a plurality of delay signals by sequentially delaying the power-up signal, and a plurality of internal circuit blocks sequentially initialized in response to a corresponding one of the power-up signal and the delay signals.

In accordance with another embodiment of the present invention, an electronic system includes a voltage generation device suitable for generating a source voltage, a delay device suitable for generating a plurality of delay voltages by sequentially delaying a power-up section of the source voltage in response to the source voltage, and a plurality of electronic devices suitable for sequentially performing an initialization operation in response to corresponding one of the source voltage and the delay voltages.

DETAILED DESCRIPTION

Figure 1:
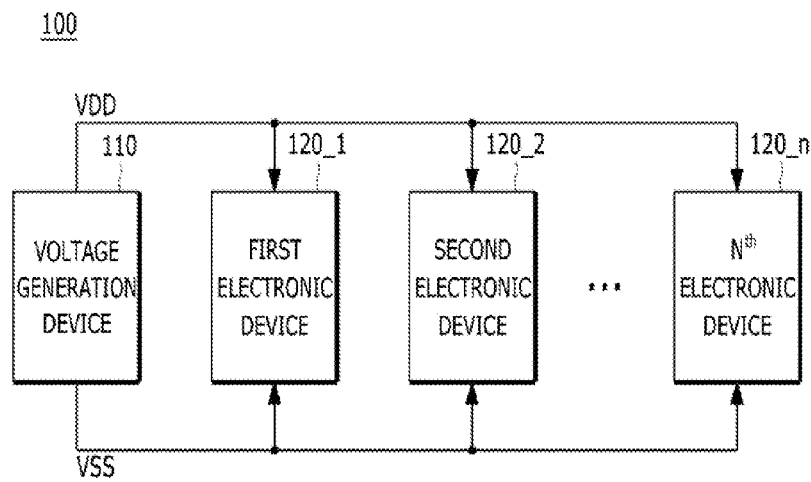
FIG. 1, illustrates an electronic system that is prior art.
Figure 2:
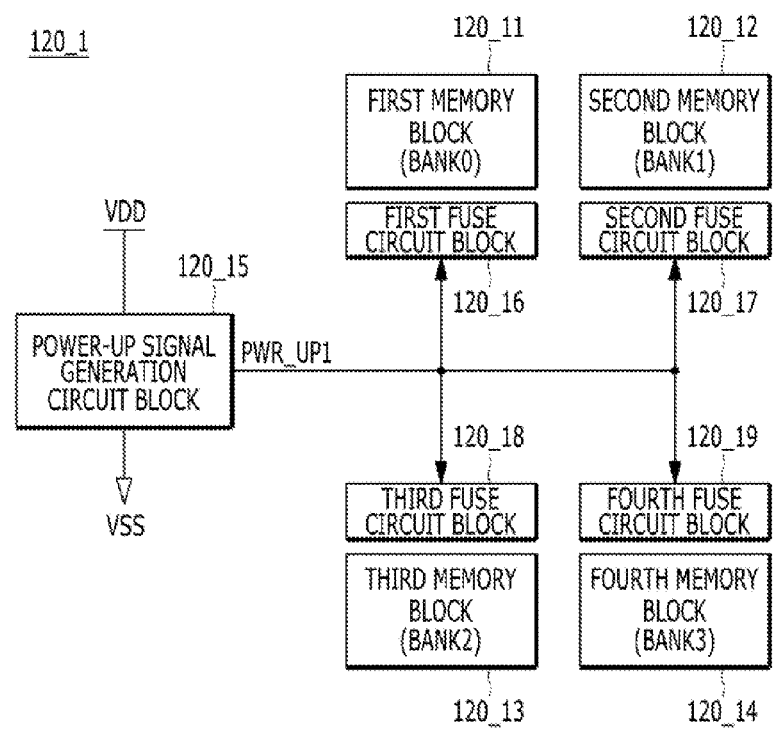
FIG. 2 illustrates an internal structure of a first electronic device shown in FIG. 1.
Figure 3:
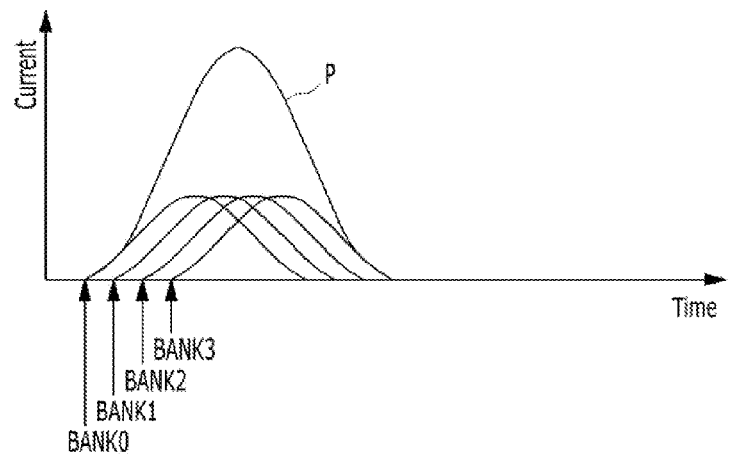
FIG. 3 illustrates a peak current caused in the electronic system shown in FIG. 1.

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention.

In the drawings, a thicknesses and lengths of components are exaggerated for convenience of illustration. In the following description, detailed explanations of known functions and constitutions may be omitted to avoid unnecessarily obscuring the subject manner of the present invention. Furthermore, 'connected coupled' represents that one component is directly coupled to another component or indirectly coupled through another component. In this specification, a singular form may include a plural form as long as it is not specifically mentioned. Furthermore, 'include/comprise' or 'including/comprising' used in the specification represents that one or more components, steps, operations, and elements exist or are added.

In the embodiments of the present invention, a Dynamic Random Access Memory (DRAM) device is used as an example of an electronic device, and fuse circuit blocks among internal circuit blocks included in the electronic device are also just examples.

Figure 4:
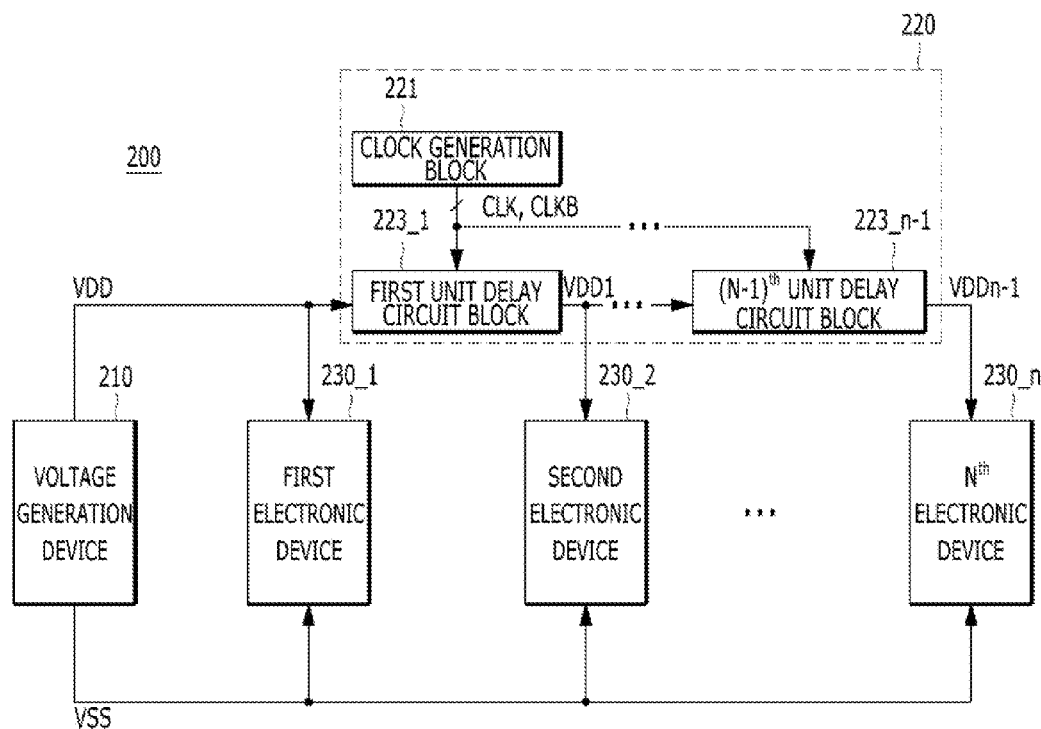
FIG. 4 illustrates an electronic system in accordance with an embodiment of the present invention.

FIG. 4 illustrates an electronic system 200 in accordance with an embodiment of the present invention.

Referring to FIG. 4, the electronic system 200 may include a voltage generation device 210, a delay device 220, and first to $n^{th}$ electronic devices 230_1 to 230_n. The voltage generation device 210 generates a power supply voltage VDD and a ground voltage VSS. The delay device 220 generates first to $(n-1)^{th}$ delay voltages VDD1 to VDDn−1 by sequentially delaying a power-up section of the power supply voltage VDD in response to the power supply voltage VDD. The first to $n^{th}$ electronic devices 230_1 to 230_n perform a predetermined operation based on the power supply voltage VDD and the ground voltage VSS and sequentially perform an initialization operation in response to the power supply voltage VDD and the first to $(n-1)^{th}$ delay voltages VDD1 to VDDn−1, respectively.

When generating the power supply voltage VDD, the voltage generation device 210 may have a power-up section where the power supply voltage VDD rises with a constant grade to a target level VDD starting from approximately 0V. Since the voltage generation device 210 is widely known to those skilled in the art, a detailed description thereon is omitted.

The delay device 220 may include a clock generation block 221 and first to $(n-1)^{th}$ unit delay circuit blocks 223_1 to 223_n−1, The clock generation block 221 generates clocks CLK and CLKB, and the first to $(n-1)^{th}$ unit delay circuit blocks 223_1 to 223_n−1 generate the first to $(n-1)^{th}$ delay voltages VDD1 to VDDn−1 in response to the clocks CLK and CLKB. For example, the clock generation block 221 may include an oscillator, The first to $(n-1)^{th}$ unit delay circuit blocks 223_1 to 223_n−1 may be coupled in series with each other and output the first to $(n-1)^{th}$ delay voltages VDD1 to VDDn−1 by delaying the respective power-up sections of the power supply voltage VDD and the first to $(n-2)^{th}$ delay voltages VDD1 to VDDn−2 outputted from the front-end unit delay circuits by a predetermined first unit delay amount. Since the first to $(n-1)^{th}$ unit delay circuit blocks 223_1 to 223_n−1 may have the same structure, the first unit delay circuit block 223_1 is representatively described hereafter.

Figure 5:
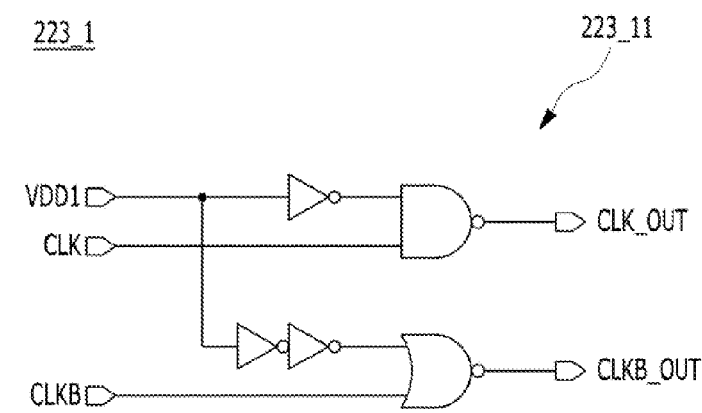
FIG. 5 exemplarily illustrates an internal structure of a first unit delay circuit block shown in FIG. 4.
Figure 5:
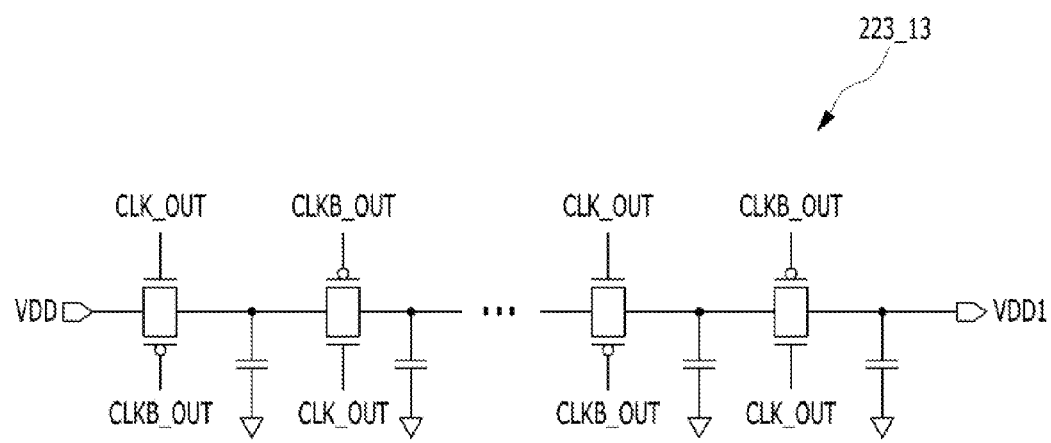

FIG. 5 exemplarily illustrates an internal structure of the first. unit delay circuit block 223_1 shown in FIG. 4.

Referring to FIG. 5, the first unit delay circuit block 223_1 may include a first clock limitation unit 223_11 and a first voltage delay unit 223_13, The first clock limitation unit 223_11 limits toggling sections of the clocks CLK and CLKB in response to the first delay voltage VDD1. The first voltage delay unit 223_13 outputs the first delay voltage VDD1 by delaying the power-up section of the power supply voltage VDD by the first unit delay amount in response to first limitation docks CLK_OUT1 and CLKB_OUT1 outputted from the first clock limitation unit 223_11.

The first clock limitation unit 223_11 may output the first limitation clocks CLK_OUT1 and CLKB_OUT1 which toggle corresponding to the clocks CLK and CLKB during a first section where the first delay voltage VDD1 is below a predetermined level and are fixed at a predetermined logic level during a second section where the first delay voltage VDD1 is over the predetermined level.

The first voltage delay unit 223_1 may include a bucket brigade device (BBD). Since the BBD is widely known to those skilled in the art, a detailed description of it will be omitted. Odd-numbered switching elements and even-numbered switching elements included in the first voltage delay unit 223_13 may alternately turn on during the first section and all turn on during the second section in response to the first limitation clocks CLK_OUT1 and CLKB_OUT1. Since the first limitation clocks CLK_OUT1 and CLKB_OUT1 do not toggle during the second section in the first voltage delay unit 223_13 noise caused by the toggling of the first limitation clocks CLK_OUT1 and CLKB_OUT1 may be prevented.

Referring back to FIG. 4, the first to $n^{th}$ electronic devices 230_1 to 230_n may be sequentially initialized based on the power-up sections of the power supply voltage VDD and the first to $(n-1)^{th}$ delay voltages VDD1 to VDDn−1 that are sequentially generated. The first to $n^{th}$ electronic devices 230_1 to 230_n may have the same structure. The first to $n^{th}$ electronic devices 230_1 to 230_n may receive the power supply voltage VDD and the first to $(n-1)^{th}$ delay voltages VDD1 to VDDn−1, respectively. Hereafter, the first electronic device 230_1 is representatively described.

Figure 6:
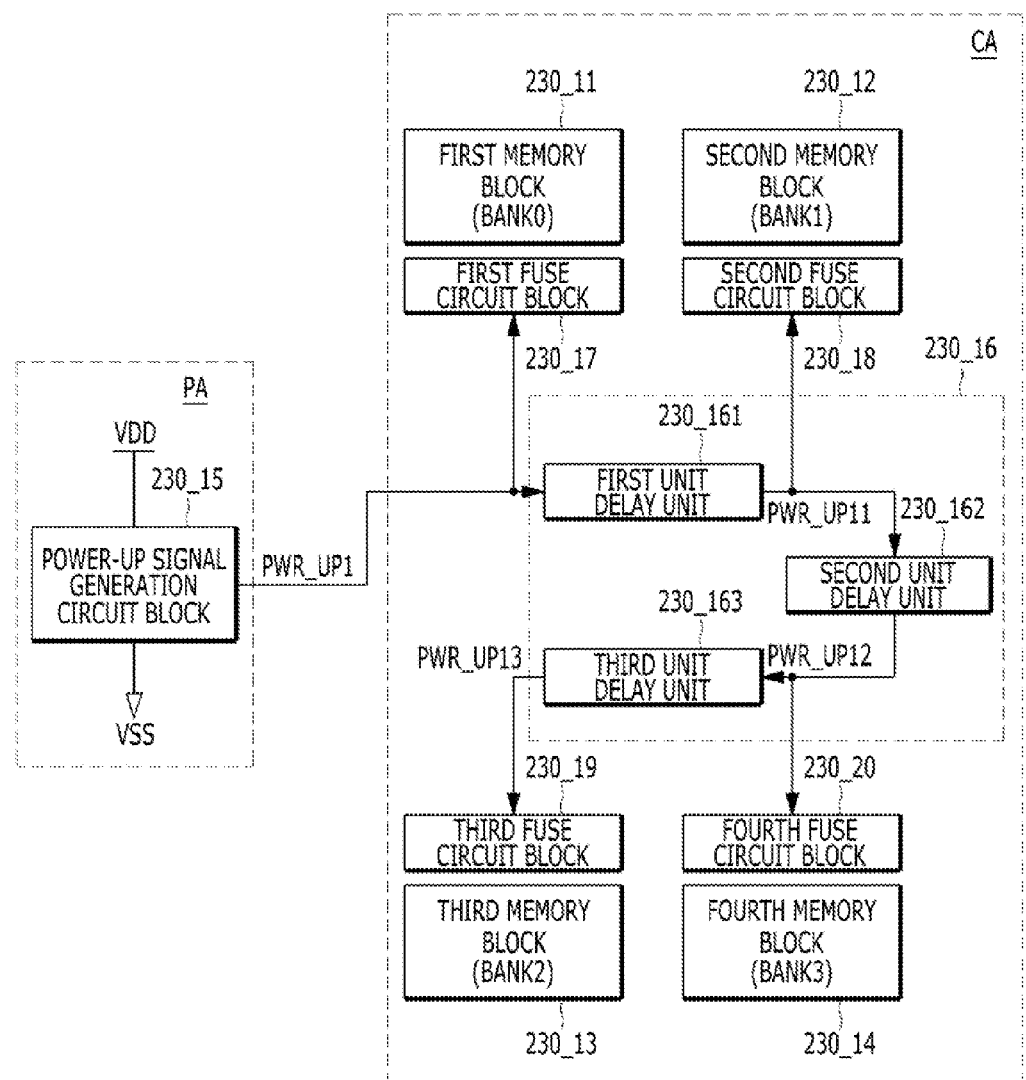
FIG. 6 exemplarily illustrates an internal structure of a first. electronic device shown in FIG. 4.

FIG. 6 exemplarily illustrates an internal structure of the first electronic device 230_1 shown in FIG. 4.

Referring to FIG. 6, the first electronic device 230_1 may include first to fourth memory blocks 230_11 to 230_14, a power-up signal generation circuit block 230_15, a delay circuit block 230_16, and first to fourth fuse circuit blocks 230_17 to 230_20. The first to fourth memory blocks 230_11 to 230_14 store and supply data. The power-up signal generation circuit block 230_15 generates a power-up signal PWR_UP1 during the power-up section of the power supply voltage VDD. The delay circuit block 230_16 generates first to third delay signals PWR_UP11, PWR_UP12 and PWR_UP13 by sequentially delaying the power-up signal PWR_UP1. The first to fourth fuse circuit blocks 230_17 to 230_20 are sequentially initialized in response to the power-up signal PWR_UP1 and the first to third delay signals PWR_UP11, PWR_UP12 and PWR_UP13.

The first to fourth memory blocks 230_11 to 230_14, the delay circuit block 230_16 and the first to fourth fuse circuit blocks 230_17 to 230_20 may be formed in a core region CA and the power-up signal generation circuit block 230_15 may be formed in a peripheral region PA.

Each of the first to fourth memory blocks 230_11 to 230_14 may include a bank. However, each of the first to fourth memory blocks 230_11 to 230_14 may include a smaller memory unit and a larger memory unit instead of the bank or as well as the bank.

The power-up signal generation circuit block 230_15 generates the power-up signal PWR_UP1 which pulses during the power-up section where the power supply voltage VDD rises with a constant grade to a target level VDD starting from approximately 0V. In other words, the power-up signal generation circuit block 230_15 enables the power-up signal PWR_UP1 when the power supply voltage VDD powers up and disables the power-up signal PWR_UP1 when the power supply voltage VDD rises above a predetermined level. Since the power-up signal generation circuit block 230_15 is widely known to those skilled in the art, a detailed description thereon is omitted.

The delay circuit block 230_16 may include first to third unit delay units 230_161 to 230_163 for generating the first to third delay signals PWR_UP11 PWR_UP12 and PWR_UP13. The first to third unit delay units 230_161 to 230_163 may be coupled in series with each other and output the first to third delay signals PWR_UP11, PWR_UP12 and PWR_UP13 by delaying the signals PWR_UP1, PWR_UP11 and PWR_UP12, which are inputted thereto, by a predetermined second unit delay amount. For example, each of the first to third unit delay units 230_161 to 230_163 may include an inverter chain (not shown).

The first to fourth fuse circuit blocks 230_17 to 230_20 may correspond one-to-one with the first to fourth memory blocks 230_11 to 230_14 at. The first to fourth fuse circuit blocks 230_17 to 230_20 may store an address of a defective memory cell included in the first to fourth memory blocks 230_11 to 230_14 to substitute the defective memory cell with a redundancy memory cell. Also, the first to fourth fuse circuit blocks 230_17 to 230_20 may be initialized based on the power-up signal PWR_UP1 and the first to third delay signals PWR_UP11, PWR_UP12 and PWR_UP13, respectively. Although the fuse circuit blocks are included in this embodiment of the present invention, this is just an example of the internal circuit blocks, and the embodiments are not intended to limit the legal protection of the present invention. The Internal circuit blocks which perform systematic operations with the first to fourth memory blocks 230_11 to 230_14 and require initialization operations may be also applied to the present invention. Since the first to fourth fuse circuit blocks 230_17 to 230_20 may have the same structure, the first fuse circuit block 230_17 is representatively described below.

Figure 7:
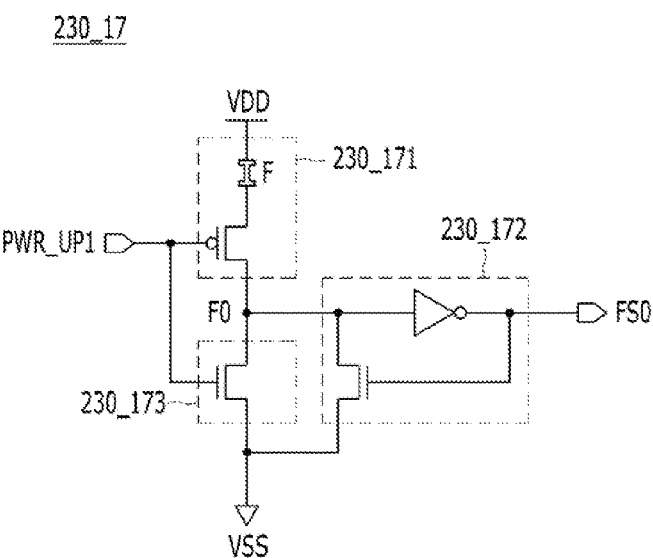
FIG. 7 exemplarily illustrates an internal structure of a first fuse circuit block shown in FIG. 6.

FIG. 7 exemplarily illustrates an internal structure of the first fuse circuit block 230_17 shown in FIG. 6.

Referring to FIG. 7, the first fuse circuit block 230_17 may include a fuse unit 230_171, a latch unit 230_172, and an initialization unit 230_173, The fuse unit 230_171 generates a fuse state signal F0 corresponding to a state of a fuse F. The latch unit 230_172 latches the fuse state signal F0. The initialization unit 230_173 initializes a logic level of the fuse state signal F0 to a level of the ground voltage VSS in response to the power-up signal PWR_UP1.

The fuse unit 230_171 may include a fuse F and a PMOS transistor for driving an output node of the fuse state signal F0 with the power supply voltage VDD based on whether the fuse F is programmed in response to the power-up signal PWR_UP1.

The latch unit 230_172 may include an inverter for outputting an inverted fuse state signal FS0, obtained by inverting the fuse state signal F0, and an NMOS transistor, which has a gate coupled with an output node of the inverted fuse state signal FS0, and a drain and a source coupled with an output node of the fuse state signal F0 and a ground voltage VSS terminal, respectively.

The initialization unit 230_173 may include an NMOS transistor where the power-up signal PWR_UP1 is inputted to a gate thereof, and a drain and a source thereof are coupled with an output node of the fuse state signal F0 and a ground voltage VSS terminal, respectively.

An operation of the electronic system 200 having the aforementioned structure in accordance with the embodiments of the present invention is described below with reference to FIGS. 8 to 10.

Figure 8:
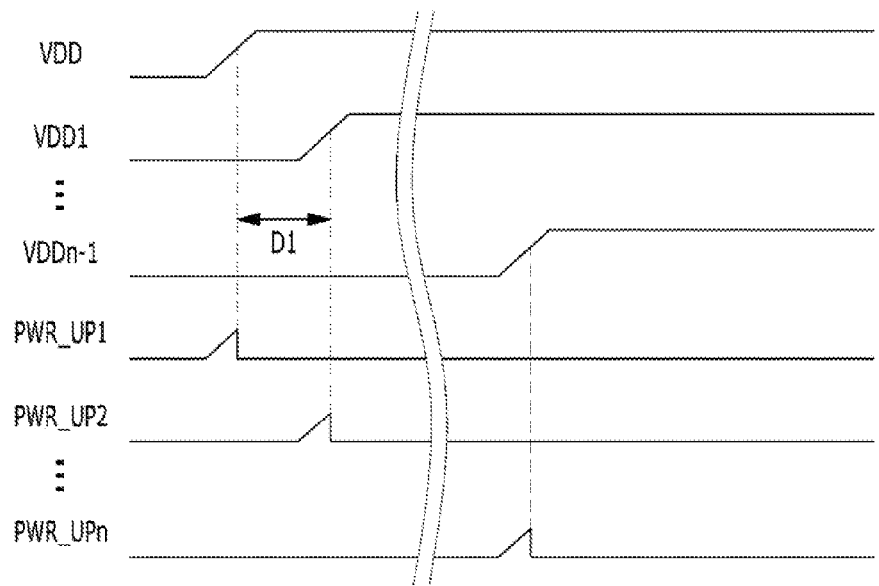
FIGS. 8 and 9 illustrate an operation of the electronic system in accordance with an embodiment of the present invention.

FIG. 8 is a timing diagram illustrating an operation of the electronic system 200 in accordance with an embodiment of the present invention.

Referring to FIG. 8, when the power supply voltage VDD is generated from the voltage generation device 210, the power supply voltage VDD may rise with a constant grade to a target level VDD starting from approximately 0V during the power-up section.

The delay device 220 may generate the first to $(n-1)^{th}$ delay voltages VDD1 to VDDn−1 by sequentially delaying the power-up section of the power supply voltage VDD by a predetermined first unit delay amount D1. For example, the first unit delay circuit block 223_1 may generate the first delay voltage VDD1 by delaying the power-up section of the power supply voltage VDD by the predetermined first unit delay amount D1 in response to the clocks CLK and CLKB, and the second unit delay circuit block 223_2 may generate the second delay voltage VDD2 by delaying the power-up section of the first delay voltage VDD1 by the first unit delay amount D1 in response to the clocks CLK and CLKB, . . . (omitted) . . . , and the $(n-1)^{th}$ unit delay circuit block 223_n−1 may generate the $(n-1)^{th}$ delay voltage VDDn−1 by delaying the power-up section of the $(n-2)^{th}$ delay voltage VDDn−2 by the first unit delay amount D1 in response to the clocks CLK and CLKB.

The first to $n^{th}$ electronic devices 230_1 to 230_n may sequentially perform an initialization operation in response to the power supply voltage VDD and the first to $(n-1)^{th}$ delay voltages VDD1 to VDDn−1. For example, the first electronic device 230_1 may be initialized in response to the power-up signal PWR_UP1 generated during the power-up section of the power supply voltage VDD, and the second electronic device 230_2 may be initialized in response to a power-up signal PWR_UP2 generated during the power-up section of the first delay voltage VDD1, and . . . (omitted) . . . , and the $n^{th}$ electronic device 230_n may be initialized in response to a power-up signal PWR_UPn generated during the power-up section of the $(n-1)^{th}$ delay voltage. Since the initialization operations of the first to n$^{th}$ electronic devices 230_1 to 230_n are the same, the initialization operation of the first electronic device 230_1 is representatively described hereafter.

Figure 9:
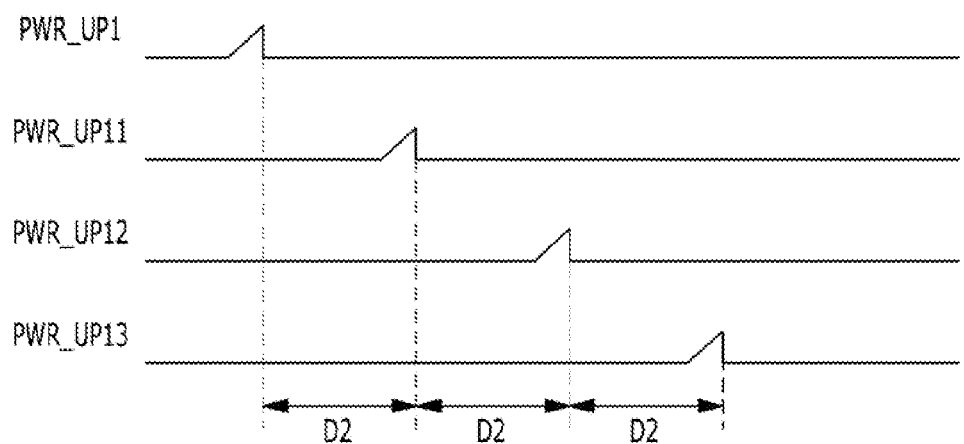

FIG. 9 is a timing diagram illustrating the initialization operation of the first electronic device 230_1.

Referring to FIG. 9, the power-up signal generation circuit block 230_15 enables the power-up signal PWR_UP1 when the power supply voltage VDD powers up and disables the power-up signal PWR_UP1 when the power supply voltage VDD rises above a predetermined level.

The delay circuit block 230 16 may output the first to third delay signals PWR_UP11 PWR_UP12 and PWR_UP13 by sequentially delaying the power-up signal PWR_UP1 as much as a second unit delay amount D2. For example, the first unit delay unit 230_161 may output the first delay signal PWR_UP11 by delaying the power-up signal PWR_UP1 by the second unit delay amount D2, and the second unit delay unit 230_162 may output the second delay signal PWR_UP12 by delaying the first delay signal PWR_UP11 by the second unit delay amount D2, and the third unit delay unit 230_163 may output the third delay signal PWR_UP13 by delaying the second delay signal PWR_UP12 by the second unit delay amount D2.

The first fuse circuit block 230_17 may be initialized in response to the power-up signal PWR_UP1. For example, an initial level of the fuse state signal F0 may be set as the latch unit 230_172 latches the fuse state signal F0 of the ground voltage VSS level when the initialization unit 201_73 initializes an output node of the fuse state signal F0 to the ground voltage VSS level in response to the power-up signal PWR_UP1. Since the initialization operations of the second to fourth fuse circuit blocks 230_18, 230_19 and 230_20 are the same as the initialization operation of the first fuse circuit block 230_17, detailed descriptions thereon will be omitted. The second to fourth fuse circuit blocks 230_18 to 230_20 may sequentially perform the initialization operations in response to the first to third delay signals PWR_UP11 PWR_UP12 and PWR_UP13.

Figure 10:
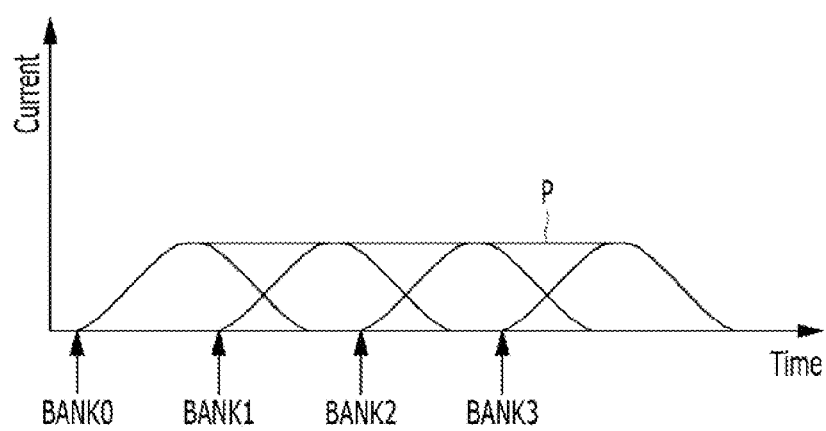
FIG. 10 illustrates a peak current occurring in the electronic system in accordance with the embodiment of the present invention.

In accordance with the embodiments of the present invention, there is an advantage that a peak current P occurring in each of the electronic devices may be reduced as compared with the prior art as shown in FIG. 10 since the fuse circuits thereof are initialized at different operation times. In addition, a peak current occurring in the electronic system including the electronic devices may be also reduced since the electronic devices are initialized at different operation times.

In accordance with the embodiments of the present invention, a peak current may be reduced during an initialization operation of an electronic system by staggering when logic circuits are initialized and staggering when electronic devices including the logic circuits are initialized.

While the present invention has been described with respect to specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

For example, although it has been described as an example that the fuse circuits are sequentially initialized, the scope of the present invention would encompass fuse circuits that are initialized in a different order.

What is claimed is:

1. An electronic system, comprising:
   a voltage generation device configured to generate a source voltage;
   a delay device configured to generate a plurality of delay voltages by sequentially delaying a power-up section of the source voltage in response to the source voltage; and
   a plurality of electronic devices configured to sequentially perform an initialization operation in response to a corresponding one of the source voltage and the delay voltages,
   wherein the delay device includes:
   a clock generation block configured to generate clocks; and
   a plurality of unit delay circuit blocks coupled in series with each other and configured to generate the delay voltages in response to the clocks, and
   wherein an n_th unit delay circuit block of the unit delay circuit blocks includes:
   a clock limitation unit configured to limit toggling sections of the clocks in response to an n_th delay voltage of the delay voltages; and
   a voltage delay unit configured to output the n_th delay voltage by delaying a power-up section of an n−1_th delay voltage by a predetermined delay amount in response to limitation clocks outputted from the clock limitation unit,
   wherein the n includes a natural number, and a first unit delay circuit block of the unit delay circuit blocks receives the source voltage as the n−1_th delay voltage.

2. The electronic system of claim 1, wherein the source voltage includes a power supply voltage VDD.

3. The electronic system of claim 1, wherein the clock limitation unit outputs the limitation clocks which toggle corresponding to the clocks during a first section where the n_th delay voltage is below a predetermined level and are fixed at a predetermined logic level during a second section where the n_th delay voltage is above the predetermined level.

4. The electronic system of claim 1, wherein the voltage delay unit includes a bucket brigade device (BBD).

5. The electronic system of claim 1, wherein each of the electronic devices includes:
   a power-up signal generation circuit block configured to generate a power-up signal during a power-up section of a corresponding one of the source voltage and the delay voltages;
   a delay circuit block configured to generate a plurality of delay signals by sequentially delaying the power-up signal; and
   a plurality of internal circuit blocks sequentially initialized in response to a corresponding one of the power-up signal and the delay signals.

6. The electronic system of claim 5, wherein each of the electronic devices further includes a plurality of memory blocks, and the internal circuit blocks that each corresponds to one of the memory blocks.

7. The electronic system of claim 6, wherein the internal circuit blocks include fuse circuit blocks for repairing the memory blocks, respectively.

8. The electronic system of claim 7, wherein each of the fuse circuit blocks includes:
   a plurality of fuse parts configured to generate a plurality of fuse state signals based on states of a plurality of fuses;

a plurality of latch parts configured to latch the fuse state signals; and a plurality of initialization parts configured to initialize logic levels of the fuse state signals in response to a corresponding one of the power-up signal and the delay signals.

9. The electronic system of claim 6, wherein each of the memory blocks includes a bank.

10. The electronic system of claim 6, wherein the memory blocks, the delay circuit block and the internal circuit blocks are fowled in a core region, and the power-up signal generation circuit block is formed in a peripheral region.

11. The electronic system of claim 5, wherein the delay circuit block includes a plurality of unit delay units for generating the delay signals.

* * * * *